United States Patent
Kushitani et al.

(10) Patent No.: US 6,633,209 B2
(45) Date of Patent: Oct. 14, 2003

(54) FILTER

(75) Inventors: Hiroshi Kushitani, Osaka (JP); Masayuki Mizuno, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 35 days.

(21) Appl. No.: 10/082,969

(22) Filed: Feb. 25, 2002

(65) Prior Publication Data

US 2002/0171510 A1 Nov. 21, 2002

(30) Foreign Application Priority Data

Feb. 27, 2001 (JP) ....................... 2001-051800

(51) Int. Cl.$^7$ ................................ H03H 7/09
(52) U.S. Cl. ...................... 333/175; 333/185
(58) Field of Search ................. 333/167, 175, 333/177, 185

(56) References Cited

U.S. PATENT DOCUMENTS

| | | | | |
|---|---|---|---|---|
| 4,894,629 A | * | 1/1990 | Okamura et al. | 333/177 |
| 4,918,570 A | * | 4/1990 | Okamura et al. | 333/202 |
| 5,105,172 A | * | 4/1992 | Khatibzadeh et al. | 333/175 |
| 5,132,647 A | * | 7/1992 | Lopez et al. | 333/175 |
| 5,612,656 A | * | 3/1997 | Sakamoto et al. | 333/204 |
| 5,699,025 A | * | 12/1997 | Kanoh et al. | 333/177 |
| 5,777,533 A | * | 7/1998 | Kato et al. | 333/185 |
| 5,955,931 A | * | 9/1999 | Kaneko et al. | 333/175 |
| 6,215,374 B1 | * | 4/2001 | Petrovic | 333/177 |
| 6,222,427 B1 | * | 4/2001 | Kato et al. | 333/185 |
| 6,236,290 B1 | * | 5/2001 | Abe et al. | 333/185 |
| 6,448,873 B1 | * | 9/2002 | Mostov | 333/185 |

FOREIGN PATENT DOCUMENTS

JP 05347528 A * 12/1993 ........ H03H/07/09

* cited by examiner

*Primary Examiner*—Seungsook Ham
(74) *Attorney, Agent, or Firm*—RatnerPrestia

(57) ABSTRACT

Here disclosed is a parallel-resonance type band-pass filter, which is employed for mobile communications equipment such as a mobile phone. According to the filter, each resonator has a single capacitor and serially connected plural inductors both of which are formed on the surface or on an inner layer of a substrate. Electromagnetic coupling between the resonators is established through electromagnetic coupling between at least a pair of inductors—the inductors of the pair belong to respective resonators. The input and the output terminals are coupled with the respective resonators via the capacitor having a properly determined capacitance. With such a simple structure, the filter also can work as an impedance transformer, with the result that the mobile communications equipment will be much smaller.

23 Claims, 6 Drawing Sheets

FILTER

FIELD OF THE INVENTION

The present invention relates to a filter typically employed in mobile communications equipment, such as a mobile phone.

BACKGROUND OF THE INVENTION

With the increasing use of a mobile phone and other mobile communications in recent years, a demand for more compact and inexpensive mobile communications equipment including mobile phones has now been growing. To serve the demands, it is essential to form each electric circuit as a component of such equipment to be smaller and lower in cost. It has been difficult, however, to structure a radio-frequency circuit section compact because of a filter that is hard to be integrated into one chip. Therefore, miniaturization and integration of each circuit component in a radio-frequency circuit section will be a key factor in structuring the equipment compact and inexpensive.

FIG. 6 is a block diagram depicting a typical radio-frequency circuit section of prior-art mobile communications equipment. In FIG. 6, an radio frequency transmission signal generated at IC 601 is fed into band-pass filter 603 via impedance transformer 602. Impedance transformer 602 is responsible for matching the impedance of IC 601 to that of transmission band-pass filter 603. After passing through band-pass filter 603, the radio frequency transmission signal is power-amplified by amplifier 604. After that, the signal goes through duplexer 605 then radiates from antenna 607. Impedance transformer 602 above may be the type that splits the signal path into two branches according to the specifications of IC 601.

In either case, impedance transformer 602 and band-pass filter 603 are separately structured as an independent circuit component, taking up too much space in the circuit. The structural limitations have therefore been an obstacle to more downsized and inexpensive equipment using such components.

SUMMARY OF THE INVENTION

The present invention addresses the problem above. It is therefore an object of the present invention to provide a downsized filter by integrating a band-pass filter with an impedance transformer into a simple structure with the help of electromagnetic coupling between parallel resonators.

The filter disclosed in the present invention is a parallel-resonance type band-pass filter, which includes a substrate, a first resonator, and a second resonator.

The first resonator includes a capacitor and a plurality of connected-in-series inductors, both of which are formed on the surface or an inner layer of a substrate.

Similarly, the second resonator includes a capacitor and a plurality of connected-in-series inductors, both of which are formed on the surface or an inner layer of a substrate.

The electromagnetic coupling between the first and second resonators is established by at least the electromagnetic coupling between one of the inductors of the first resonator and one of the inductors of the second resonator.

The present invention has various aspects described below:

(1) inductors for each resonator may be three or more connected-in-series inductors. In this case, flexibility in designing a resonator will be increased.

(2) a capacitor for each resonator may be an inter-digital type capacitor. This will realize a capacitor formed on a single layer substrate, allowing the filter to have a low profile.

(3) employing a balanced-type terminal for at least one of the input terminal and the output terminal, and connecting each terminal of the balanced-type terminal with a resonator via a capacitor. This will realize a balanced-type, 2-stage parallel-resonance type band-bass filter (4) grounding the middle point of the connected inductors in the resonator will eliminate unstable operations occurred at the grounded position in frequencies of the microwave-frequency band or higher.

(5) making a difference between the input impedance and the output impedance of a filter allows the filter to also serve as an impedance transformer as well.

(6) employing a dielectric material for the substrate will realize a smaller filter.

(7) employing a semiconductor wafer for the substrate allows a filter not only to be compact, but also to integrate with other semiconductor parts onto an IC chip.

(8) aforementioned semiconductor may be: i)silicon, ii) gallium arsenide, iii) silicon-germanium, iv) indium phosphide, or v) a compound having any one of elements above i) through iv) as a major constituent. Such formed filter will be able to exploit each own advantage according to a use.

(9) aforementioned inductors may be formed by an intaglio-printing technique or a thin-film forming technique to form the filter compact.

(10) aforementioned capacitors may be formed by a thin film-, or a thick film-forming techniques to form the filter compact.

(11) the filter electrodes may be made of: i) copper, ii) silver, or iii) a metal compound having one of copper and silver as a major constituent. This contributes to a strength-increased substrate, or simplified manufacturing steps.

With such structures described above, according to the present invention, it is possible to form a filter not only determining the degree of coupling with flexibility between the resonators, but also determining an input impedance so as to be different from an output impedance. This advantage realizes a band-pass filter that doubles as an impedance transformer, shrinking the physical size of mobile communications equipment using the filter.

DESCRIPTION OF THE PREFERRED EMBODIMENTS

The preferred embodiments of the present invention are described hereinafter with reference to the accompanying drawings.

First Preferred Embodiment

Figure 1:
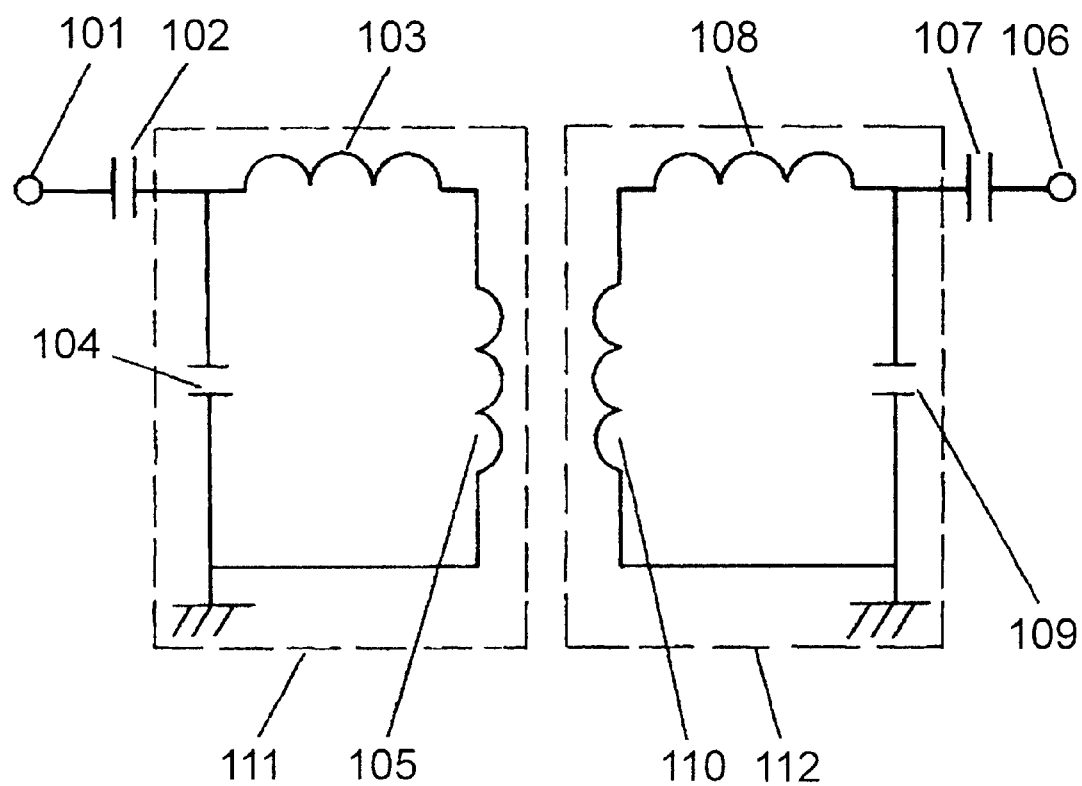
FIG. 1 is a circuit diagram of the filter in accordance with a first preferred embodiment of the present invention.

In the filter of the embodiment, as shown in FIG. 1, resonator 111 is electromagnetically coupled with resonator 112 through inductors 105 and 110. Resonator 111 is formed of a parallel-resonance circuit having two connected-in-series inductors 103, 105; and capacitor 104 placed across the inductors. Similarly, resonator 112 is formed of a parallel-resonance circuit having two connected-in-series inductors 108, 110; and capacitor 109 placed across the inductors.

As shown in FIG. 1, inductor 103 and capacitor 104 are connected to capacitor 102, which is connected to input terminal 101. On the other hand, inductor 108 and capacitor 109 are connected to capacitor 107, which is connected to output terminal 106. Each connecting point of capacitor 104 and inductor 105, and of capacitor 109 and inductor 110 is grounded.

Here will be described how such structured filter works. In resonator 111, capacitor 104 has a given capacitance. Resonance frequency $f_0$ of resonator 111 is derived from the capacitance of capacitor 104 and a combined inductance of inductors 103, 105. The capacitance of capacitor 102 is determined according to J-inverter on generator side based on a filter-designing theory—for detailed information on J-inverter, for example, see "*Microwave Filters, Impedance-Matching Networks, and Coupling Structures*" written by G. L. Matthaei, L. Young, and E. M. Jones, McGraw-Hill New York, 1964.

The capacitance of capacitor 104 is corrected on the basis of the J-inverter. Similarly, in resonator 112, capacitor 109 has a given capacitance. According to the capacitance of capacitor 109, a combined inductance of inductors 108 and 110 is determined so as to be equal to resonance frequency $f_0$ of resonator 112. The capacitance of capacitor 107 is determined according to J-inverter on load side, and according to which, the capacitance of capacitor 109 is corrected.

The physical distance between inductors 105 and 110 is related to mutual inductance "M"—the value of mutual inductance "M" determines the positional relation between the inductors. Mutual inductance "M" is given by the equations below:

$$k = J/b,$$

then, $$M = k \cdot [L_{105} \cdot L_{110}]^{1/2}$$

Where, J indicates a value of J-inverter between the resonators; b indicates a susceptance slope parameter of resonator 111 or 112; k indicates a degree of coupling between resonators 111 and 112; $L_{105}$ indicates the inductance of inductor 105; and $L_{110}$ indicates the inductance of inductor 110.

The equation above is expressed as below, using the corrected circuit component values (indicated by each symbolic letter with "'") according to the J-inverter:

$$M = k' \cdot [L'_{105} \cdot L'_{110}]^{1/2}$$

The degree of coupling (indicated by k) can take any given value as long as the equations below are satisfied.

$$k' = n \cdot k,$$

$$L'_{105} = L_{105}/n,$$

$$L'_{110} = L_{110}/n,$$

$$L'_{103} + L'_{105} = L_{103} + L_{105} = \text{constant},$$

$$L'_{108} + L'_{110} = L_{108} + L_{110} = \text{constant},$$

where, n takes a proper real number, and $L_{103}$ and $L_{108}$ indicate the each inductance of inductors 103 and 108.

Such determined k brings greater design flexibility not only in forming the inductors, but also in determining the positional relation between inductors 105 and 110 in the circuit.

The circuit with the structure above functions as a 2-stage parallel-resonance type band-pass filter having input terminal 101 and output terminal 106, thereby realizing a smaller filter.

Figure 2:
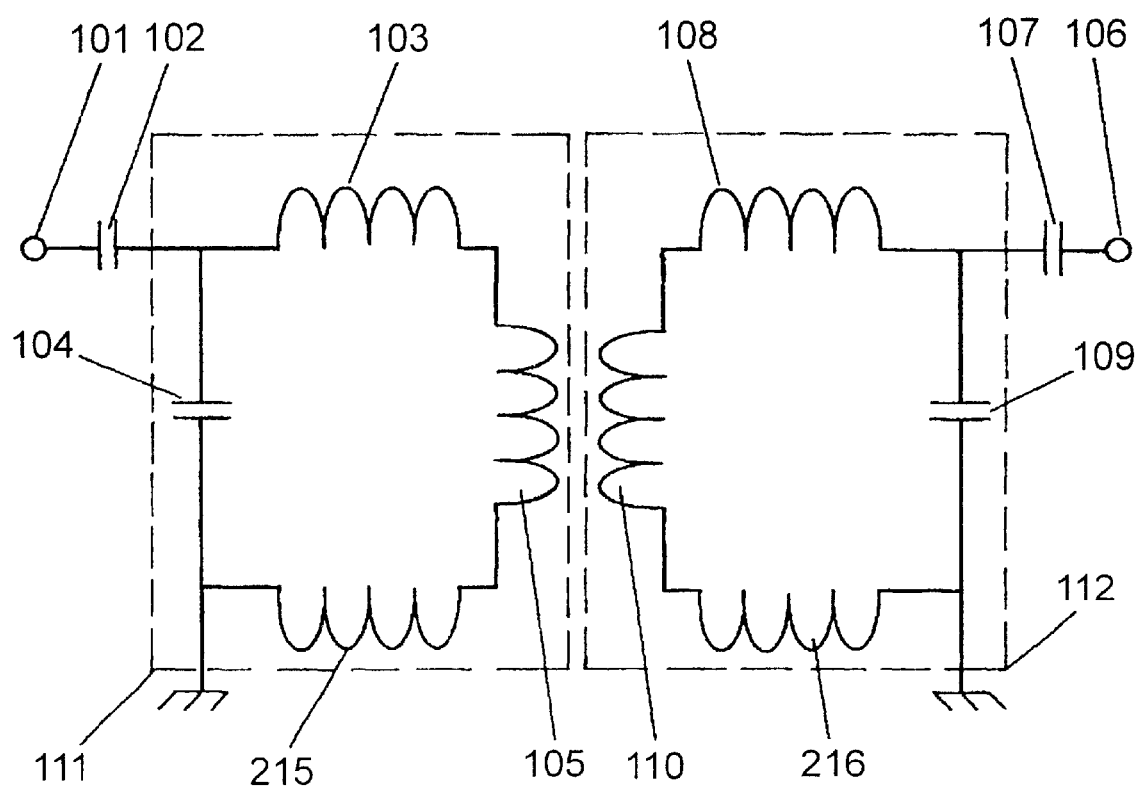
FIG. 2 is another circuit diagram of the filter in accordance with the first preferred embodiment.

Although two inductors are employed for the resonator of the embodiment, it is not limited to this: the resonator may include three or more inductors, as shown in FIG. 2. Such a structure advantageously increases flexibility in laying out the circuit components on a substrate.

Besides, the capacitor of the embodiment may be an inter-digital type capacitor. In this case, it is possible to form capacitor electrodes into a single layer, allowing the entire filter circuit to be formed into a single layer.

Therefore, with such structured filter described in the embodiment, mobile communications equipment becomes much smaller.

Second Preferred Embodiment

Figure 3:
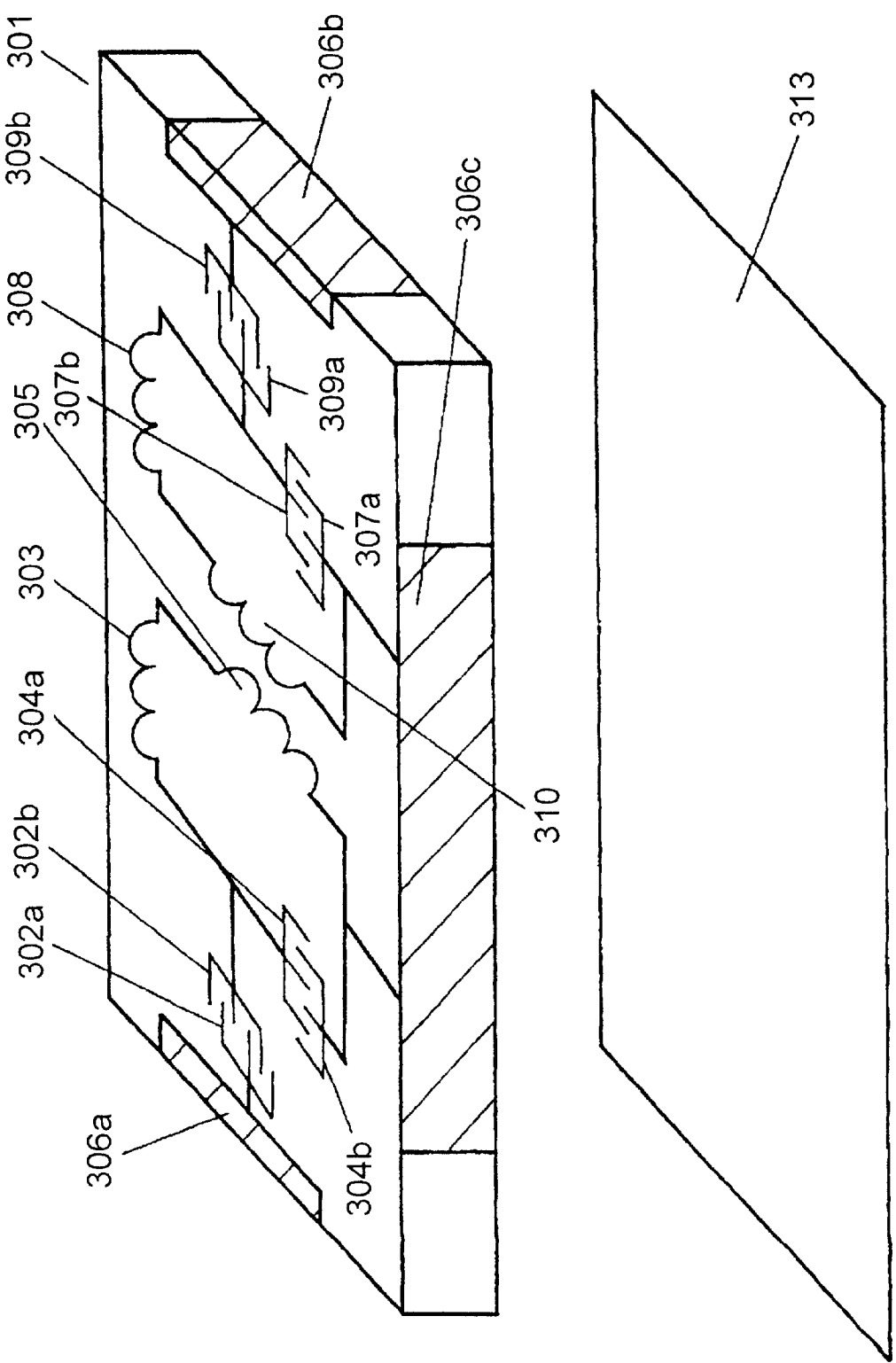
FIG. 3 is a circuit diagram of the filter in accordance with a second preferred embodiment of the present invention.

FIG. 3 is a block diagram of the filter in accordance with the second preferred embodiment of the present invention. According to the embodiment, circuit components forming a filter are arranged on the top surface of dielectric substrate 301. At least three terminal electrodes—terminals 306a, 306b, and 306c—for an input terminal, an output terminal, and a grounding section, as shown in FIG. 3, are formed on the side surfaces of substrate 301. Between the two resonators in FIG. 3, electromagnetic coupling is established through inductor electrodes 305 and 310. The first resonator forms a parallel-resonance circuit, including connected-in-series two inductor electrodes 303, 305; and capacitor electrode 304 placed across the inductors—from the figure, it will be understood that electrode 304 contains electrodes 304a and 304b. Like the first resonator, the second resonator forms a parallel resonance circuit, including connected-in-series two inductor electrodes 308, 310; and capacitor electrode 307 placed across the inductors. Inductor electrode 303 and capacitor electrode 304, as shown in FIG. 3, are connected to capacitor electrode 302, which is to be connected with terminal electrode 306a. Similarly, inductor electrode 308 and capacitor electrode 307 are connected to capacitor electrode 309, which is to be connected with terminal electrode 306b. The connecting points of capacitor electrode 304 and inductor electrode 305, and of capacitor electrode 307 and inductor electrode 310 are both connected with terminal electrode 306c. Terminal electrode 306c is connected to grounding electrode 313 formed on the rear surface of substrate 301.

Now will be described how such structured filter works. According to the filter of the embodiment, as described above, the capacitor electrodes operate in pairs to form an inter-digital type capacitor. On the other hand, the inductor electrodes work with an inductance proportional to a characteristic impedance of a transmission path, which is determined by the dielectric constant, the thickness, the shape and the dimensions of the electrode of dielectric substrate 301. That is, the filter has the structure the same as that of the first preferred embodiment, working as a 2-stage parallel-resonance type band-pass filter. As an additional plus, the circuit components of the filter can be formed by an electrode pattern with extra-fine lines, thereby realizing a compact filter with an easily formed circuit configuration.

Although the electrode of the embodiment is formed on the surface of the dielectric substrate, it can be formed on an inner layer of a multi-layered dielectric substrate. In this case, the capacitor can be structured in a parallel-plate-type, offering an advantage in that the capacitor bears a greater capacitance. Besides, it is possible to form the inductor into a spiral-type to be compact.

Now will be described substrate materials and manufacturing method of circuit components.

(1) Substrate Materials

Although the electrode of the embodiment is formed on the surface of a dielectric substrate, it can be formed on or in a semiconductor wafer. In this case, the filter can be not only formed compact, but also formed, together with semiconductor parts including a transistor and a diode, into one IC chip.

When a semiconductor wafer is used for the substrate, instead of dielectric materials, the semiconductor may be silicon or a compound containing silicon as a major constituent. Such a general versatile semiconductor material offers an advantage in realizing a general-purpose manufacturing process.

As another choice, the semiconductor may be gallium arsenide or a compound containing gallium arsenide as a major constituent. Such formed substrate allows a filter to easily integrate with amplifying and switching circuits, or transistor and other parts, increasing the scale of an integrated circuit.

As still another choice, the semiconductor may be silicon-germanium or a compound containing silicon-germanium as a major constituent. The material contributes to a cost-reduced filter.

As yet another choice, the semiconductor may be indium phosphide or a compound containing indium phosphide as a major constituent. The material enables to easily form a filter that can work in the microwave-frequency band or higher.

(2) Manufacturing Method of the Circuit Components

Inductors and capacitors, which are the circuit components of the embodiment, can be formed by a thick-film forming technique. In this case, a screen-printing technique can be employed to simplify the manufacturing process.

As another choice, the inductors and capacitors may be formed by a thin-film forming technique. In this case, an intaglio-printing technique can be employed. Using the technique has advantages in that the capacitor can be downsized, as well as the inductors—furthermore, a microcapacitor can be produced as needed.

In addition, the inductors and capacitors of the embodiment can be made of copper or a metal compound containing copper as a major constituent. In this case, the substrate of the component can bear high sintering temperature, thereby increasing mechanical strength of substrate.

As another choice, the inductors and capacitors of the embodiment may be made of silver or a metal compound containing silver as a major constituent. In this case, the substrate can be sintered together with the inductors and capacitors, thereby simplifying the manufacturing process.

Therefore, with such structured filter described in the embodiment, mobile communications equipment becomes much smaller.

Third Preferred Embodiment

Figure 4:
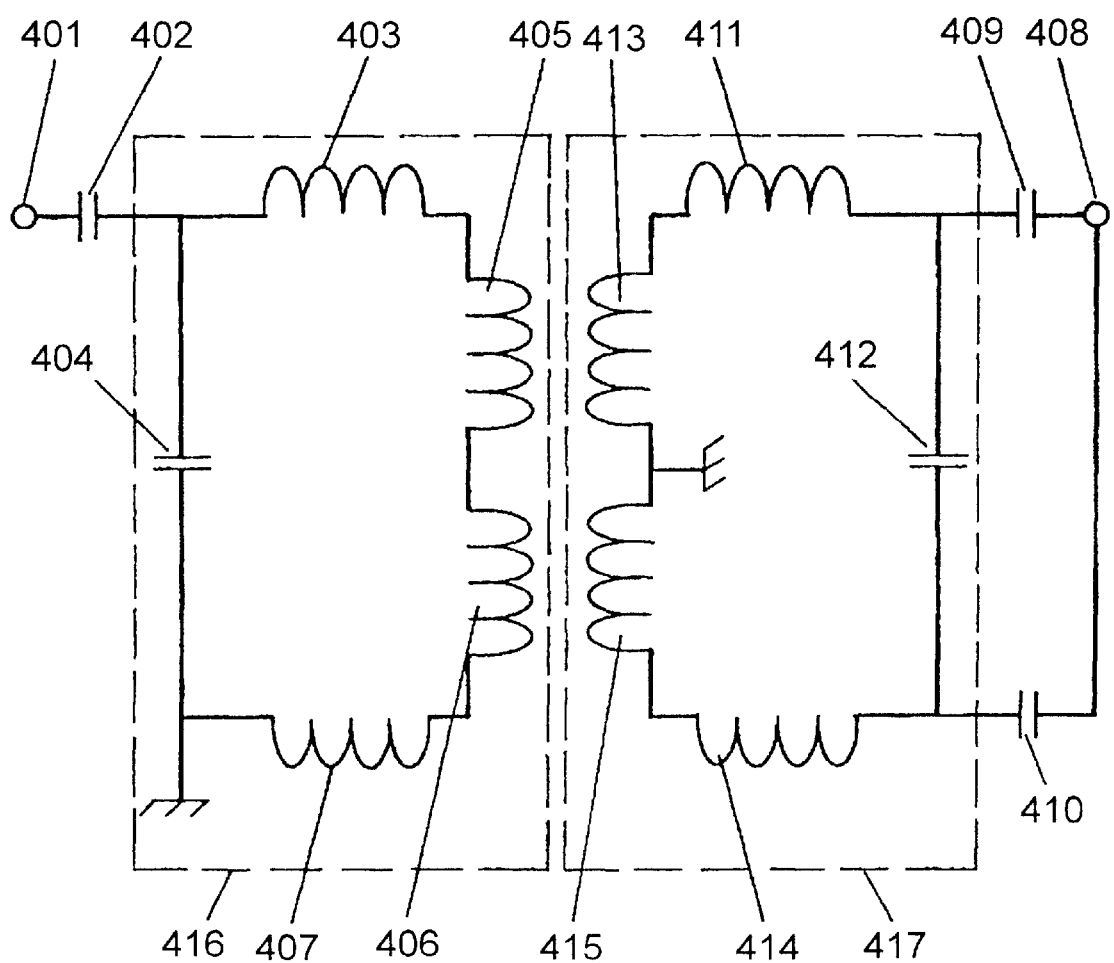
FIG. 4 is a circuit diagram of the filter in accordance with a third preferred embodiment of the present invention.

FIG. 4 is a circuit diagram of the filter according to the third preferred embodiment of the present invention. In the filter of the embodiment, as shown in FIG. 4, resonators 416 and 417 are electromagnetically coupled with each other through the electromagnetic coupling established between inductors 405 and 413, and between inductors 406 and 415. Resonator 416 forms a parallel-resonance circuit, including connected-in-series inductors 403, 405, 406, and 407; and capacitor 404 placed across these inductors. Similarly, resonator 417 forms a parallel-resonance circuit, including connected-in-series inductors 411, 413, 415, and 414; and capacitor 412 placed across these inductors.

Resonator 416 is connected to input terminal 401 via capacitor 402. To capacitor 402, inductor 403 and capacitor 404 of resonator 416 are connected as shown in FIG. 4. On the other hand, resonator 417 is connected, as shown in FIG. 4, to output terminal 408 via capacitors 409 and 410. To capacitor 409, inductor 411 and capacitor 412 of resonator 417, while to capacitor 410, inductor 414 and capacitor 412 are connected. The connecting points of inductor 407 and capacitor 404 of resonator 416, and of inductor 413 and inductor 415 of resonator 417 are both grounded.

Now will be described hereinafter how such structured filter works. Capacitor 404 has a given capacitance. Resonance frequency $f_0$ of resonator 416 is derived from the capacitance of capacitor 404 and a combined inductance of inductors 403, 405, 406, and 407. The capacitance of capacitor 402 is determined according to J-inverter on generator side based on a filter-designing theory. The capacitance of capacitor 404 is corrected on the basis of the J-inverter. Similarly, capacitor 412 has a given capacitance. According to the capacitance of capacitor 412, a combined inductance of inductors 411, 413, 414, and 415 is determined so that the resonance frequency of resonator 417 is equal to $f_0$. Each capacitance of capacitors 409 and 410 is determined so as to take a value doubled the value according to J-inverter on load side, and the capacitance of capacitor 412 is corrected according to the value of J-inverter. The physical distance between inductors 405 and 413 is related to mutual inductance $M_{26}$: the value of mutual inductance $M_{26}$ determines the positional relation between the inductors. Similarly, the physical distance between inductors 406 and 415 is related to mutual inductance $M_{38}$, which determines the positional relation between the inductors 406 and 415. These Mutual inductances $M_{26}$ and $M_{38}$ are given by the equations below:

$$k=J/b,$$

then, $$M_{26}=k\cdot[L_{405}\cdot L_{413}]^{1/2},$$

$$M_{38}=k\cdot[L_{406}\cdot L_{415}]^{1/2},$$

Where, J indicates a value of J-inverter between the resonators; b indicates a susceptance slope parameter of resonator 416 or 417; k indicates a degree of coupling between resonators 416 and 417; $L_{405}$, $L_{406}$, $L_{413}$, and $L_{415}$ indicate the inductance of inductors 405, 406, 413, and 415, respectively.

Here, each inductance of the inductors above is determined so as to satisfy the equations below:

$$L_{403}=L_{407},$$

$$L_{405}=L_{406},$$

$$L_{411}=L_{414},$$

$$L_{413}=L_{415}.$$

Where, $L_{403}$, $L_{407}$, $L_{411}$, and $L_{414}$ indicate the inductance of inductors 403, 407, 411, and 414, respectively.

The equation above is expressed as below, using the corrected circuit component values (indicated by each symbolic letter with "'") according to the J-inverter:

$$M_{26}=k'\cdot[L'_{405}\cdot L'_{413}]^{1/2},$$

$$M_{38}=k'\cdot[L'_{406}\cdot L'_{415}]^{1/2}.$$

The degree of coupling (indicated by k) can take any given value as long as the equations below are satisfied.

$$k'\cdot n\cdot k,$$

$$L'_{405}=L_{405}/n,$$

$$L'_{406}=L_{406}/n,$$

$$L'_{413}=L_{413}/n,$$

$$L'_{415}=L_{415}/n,$$

$$L'_{403}+L'_{405}+L'_{406}+L'_{407}=L_{403}+L_{405}+L_{406}+L_{407}=\text{constant},$$

$$L'_{411}+L'_{413}+L'_{414}+L'_{415}=L_{411}+L_{413}+L_{414}+L_{415}=\text{constant},$$

where, n takes a proper real number.

Such determined k brings greater design flexibility not only in forming the inductors, but also in determining the positional relation between inductors 405 and 413, and between inductors 406 and 415. Therefore, It becomes possible to form the circuit components of the filter by an extra fine lined-electrode pattern, with the component positioned closer to each other.

Such structured filter has input terminal 401 and output terminal 408, with the side of output terminal 408 formed into a balanced type—the filter functions as a 2-stage parallel-resonance type band-pass filter. As an additional plus, the circuit components of the filter can be formed by an extra fine lined-electrode pattern, thereby realizing a compact filter with an easily formed circuit configuration.

The connecting point of inductor 413 and inductor 415 is not necessarily grounded, although it is done in the embodiment. Grounding, however, conveniently eliminates an unstable operation at the connecting point in the microwave-frequency band or higher.

While the dielectric substrate, and the conductor patterns described in the embodiment can be formed by various methods, it will be understood that the present invention is not limited to any one of them.

According to the embodiment, as described above, with the shrunk filter, mobile communications equipment becomes much smaller.

Fourth Preferred Embodiment

Figure 5:
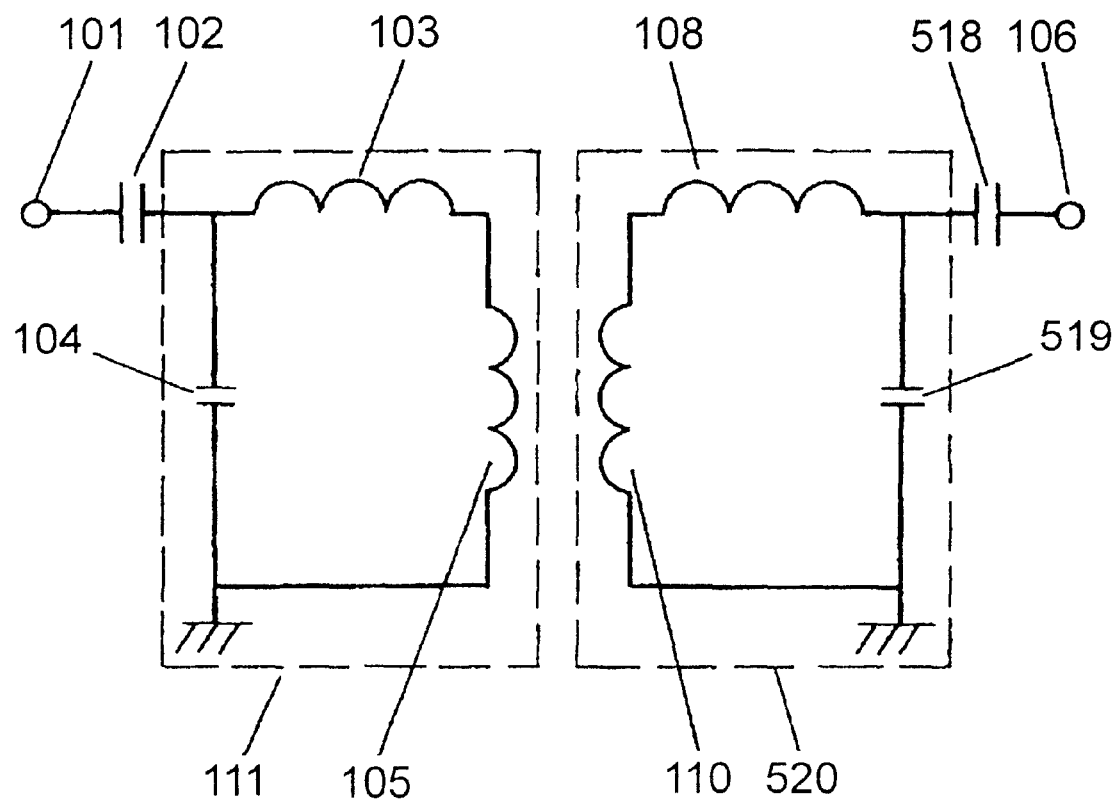
FIG. 5 is a circuit diagram of the filter in accordance with a fourth preferred embodiment of the present invention.
Figure 6:
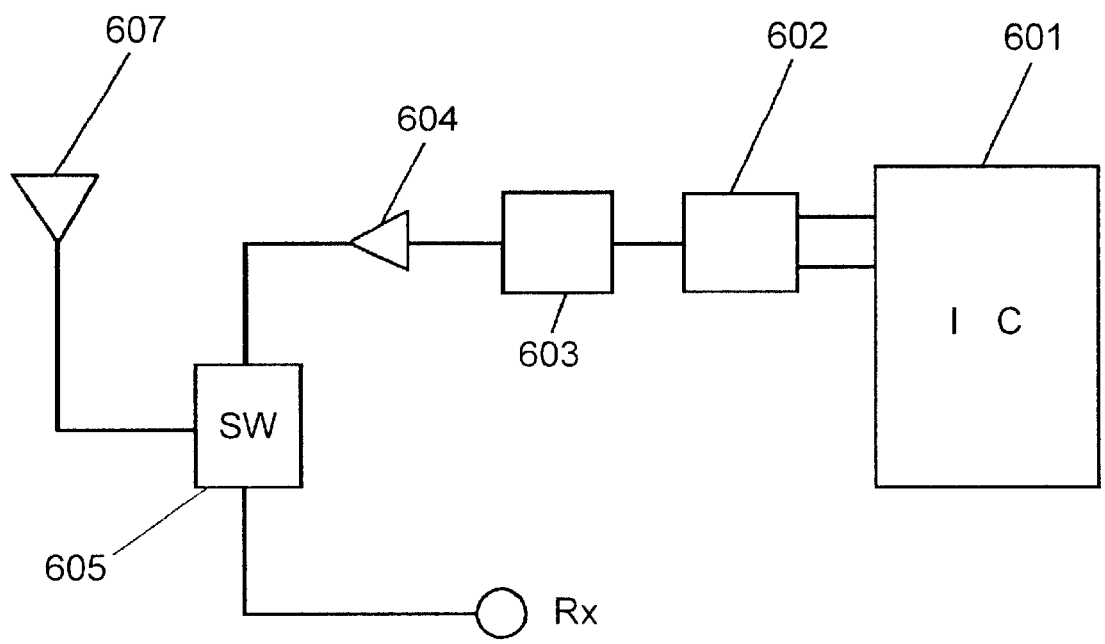
FIG. 6 is a circuit block diagram of mobile communications equipment using a prior-art filter.

FIG. 5 is a circuit diagram of the filter according to the fourth preferred embodiment of the present invention. As the filter of the embodiment is formed basically the same as that described in the first preferred embodiment, those parts corresponding to the components in the first preferred embodiment will be identified with the same numbers, and detailed explanations thereof will be omitted. In FIG. 5, capacitor 518 connects terminal 106 to second resonator 520, and capacitor 519 is a circuit component of the second resonator 520. Each capacitance of the capacitors is determined different from those in the first preferred embodiment.

Here will be described how such structured filter works. In the filter of the embodiment shown in FIG. 5, the impedance on load side is differently determined from that on generator side. The value of J-inverter on load side is given by the equation below.

$$J=[(1/Z)\cdot 2\pi\cdot\omega\cdot C/(g_2\cdot g_3)]^{1/2}$$

where, ω indicates a bandwidth; C indicates the capacitance of capacitor 519 determined at any given value; and $g_2$, $g_3$ indicate the second and the third g-parameters, respectively, in the prototype filter of the filter circuit of the embodiment.

In the filter of the embodiment, as described above, the J-inverter in the equation is so determined that load impedance "Z" takes a value different from that on generator side. The capacitance of capacitor 518 is determined according to such defined J-inverter having a value of "J". Also, substituting "J" into the equation described above, the corrected capacitance of capacitor 519 can be obtained.

The filter with the structure described above works as a filter having input impedance different from output impedance. In other words, the filter functions as a 2-stage parallel-resonance type band-pass filter, which doubles as an impedance transformer. Besides, as is the case with the aforementioned embodiments, the circuit components of the filter can be formed by an electrode pattern with extra-fine lines, thereby realizing a compact filter with an easily formed circuit configuration.

The idea—forming the filter to serve as an impedance transformer—of the embodiment is also applicable to the third preferred embodiment. In this case, the filter works as a balanced-, 2-stage parallel-resonance-type band-pass filter, serving as an impedance transformer. Moreover, the circuit components of the filter can be formed by extra fine lined-electrode patterns, thereby realizing a compact filter with an easily formed circuit configuration.

With the filter according to the present invention, as described above, it will be possible not only to determine with flexibility the degree of coupling between the resonators, but also to determine the input impedance so as to be different from the output impedance. This fact allows the band-pass filter to also behave as an impedance transformer, and mobile communications equipment with such a compact filter will shrink its physical size.

What is claimed is:

1. A parallel-resonance type band-pass filter comprising:
   a substrate;
   a first resonator including:
      i) a first capacitor; and
      ii) a first plurality of inductors connected to each other in series, both of which are formed on a common surface, or on a common inner layer of the substrate; and
   a second resonator including:
      i) a second capacitor; and
      ii) a second plurality of inductors connected to each other in series, both of which are formed on the common surface, or on the common inner layer of the substrate,
   wherein electromagnetic coupling between the first resonator and the second resonator is performed by at least electromagnetic coupling between one of the first plurality of inductors and one of the second plurality of inductors, and
   wherein the resonance frequency of the first resonator is derived from a capacitance of the first capacitor and a combined inductance of the respective inductances of the first plurality of inductors.

2. The filter of claim 1, wherein the first resonator and the second resonator are respectively coupled with an input terminal and an output terminal of the filter via a capacitor.

3. The filter of claim 1, wherein each number of the first plurality of inductors and the second plurality of inductors is at least three.

4. The filter of claim 1, wherein the first capacitor and the second capacitor are inter-digital type capacitors.

5. The filter of claim 2, wherein the first capacitor, the second capacitor, and the capacitors which connect the input terminal and the output terminal to the first resonator and the second resonator respectively are inter-digital type capacitors.

6. The filter of claim 2, wherein at least one of the input terminal and the output terminal is a balanced-type terminal, and any one of the first resonator and the second resonator, which is connected to the balanced-type terminal, is connected to each terminal of the balanced-type terminal via the capacitor.

7. The filter of claim 6, wherein the capacitor which is connected to the balanced-type terminal is an inter-digital type capacitor.

8. The filter of claim 1, wherein a middle point of at least one of the first plurality of inductors and the second plurality of inductors is grounded.

9. The filter of claim 1, wherein the filter has an input impedance different from an output impedance.

10. The filter of claim 1, wherein the substrate is made of a dielectric material.

11. The filter of claim 1, wherein the substrate is made of a semiconductor wafer.

12. The filter of claim 1, wherein the substrate is made of a semiconductor wafer, the semiconductor is any one of i) silicon, ii) gallium arsenide, iii) silicon-germanium, iv) indium phosphide, and v) a compound having any one of the silicon, the gallium arsenide, the silicon-germanium, and the indium phosphide, as a major constituent.

13. The filter of claim 1, wherein the inductors structuring the first resonator and the second resonator are formed by any one of an intaglio-printing technique and a thin-film forming technique.

14. The filter of claim 1, wherein the first capacitor and the second capacitor are formed by any one of a thick-film forming technique and a thin-film forming technique.

15. The filter of claim 2, wherein the first capacitor, the second capacitor, and the respective capacitors connecting the first and the second resonators to the input and the output terminals are formed by any one of a thick-film forming technique and a thin-film forming technique.

16. The filter of claim 1, wherein an electrode forming the filter are made any one of i) copper, ii) silver, and iii) a metal compound having one of the copper and the silver as a major constituent.

17. The filter of claim 2, wherein a middle point of at least one of the first plurality of inductors and the second plurality of inductors is grounded.

18. The filter of claim 2, wherein the filter has an input impedance different from an output impedance.

19. The filter of claim 2, wherein the substrate is made of a dielectric material.

20. The filter of claim 2, wherein the substrate is made of a semiconductor wafer.

21. The filter of claim 2, wherein the substrate is made of a semiconductor wafer, the semiconductor is any one of i) silicon, ii) gallium arsenide, iii) silicon-germanium, iv) indium phosphide, and v) a compound having any one of the silicon, the gallium arsenide, the silicon- germanium, and the indium phosphide, as a major constituent.

22. The filter of claim 2, wherein the first capacitor and the second capacitor are formed by any one of a thick-film forming technique and a thin-film forming technique.

23. The filter of claim 2, wherein an electrode forming the filter are made any one of i) copper, ii) silver, and iii) a metal compound having one of the copper and the silver as a major constituent.

* * * * *